United States Patent
Lin et al.

(10) Patent No.: US 11,569,291 B2
(45) Date of Patent: Jan. 31, 2023

(54) IMAGE SENSOR AND METHOD FORMING THE SAME

(71) Applicant: VisEra Technologies Company Limited, Hsin-Chu (TW)

(72) Inventors: Kuei-An Lin, Zhubei (TW); Chi-Han Lin, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 17/090,298

(22) Filed: Nov. 5, 2020

(65) Prior Publication Data

US 2022/0139996 A1 May 5, 2022

(51) Int. Cl.
*H01L 27/146* (2006.01)

(52) U.S. Cl.
CPC .. *H01L 27/14685* (2013.01); *H01L 27/14627* (2013.01); *H01L 27/1463* (2013.01); *H01L 27/14621* (2013.01); *H01L 27/14623* (2013.01)

(58) Field of Classification Search
None
See application file for complete search history.

(56) References Cited

U.S. PATENT DOCUMENTS

| | | | | |
|---|---|---|---|---|
| 2008/0286896 A1* | 11/2008 | Jung | ............ | G02B 3/0012 257/E31.127 |
| 2008/0290383 A1* | 11/2008 | Dunne | ............ | G02B 3/0018 257/292 |
| 2009/0121371 A1* | 5/2009 | Kawasaki | ............ | G02B 3/0018 264/2.7 |
| 2012/0225516 A1* | 9/2012 | Hsieh | ............ | H01L 27/14685 257/E31.127 |
| 2014/0306360 A1* | 10/2014 | Li | ............ | G02B 3/0043 264/1.7 |
| 2019/0267420 A1* | 8/2019 | Lee | ............ | H01L 27/14603 |

FOREIGN PATENT DOCUMENTS

| | | |
|---|---|---|
| JP | 2007305866 A | 11/2007 |
| JP | 200860198 A | 3/2008 |
| JP | 2012156311 A | 8/2012 |
| JP | 20134635 A | 1/2013 |
| JP | 201475445 A | 4/2014 |
| JP | 201565268 A | 4/2015 |
| JP | 2015-230896 | 12/2015 |
| KR | 10-2011-0072520 | 6/2011 |
| KR | 10-2011-0079336 | 7/2011 |

(Continued)

*Primary Examiner* — Ali Naraghi
(74) *Attorney, Agent, or Firm* — Muncy, Geissler, Olds & Lowe, P.C.

(57) ABSTRACT

A method forming an image sensor includes: providing a substrate including a plurality of sensing portions; forming a color filter layer on the substrate; forming a micro-lens material layer on the color filter layer; and forming a hard mask pattern on the micro-lens material layer, wherein the hard mask pattern has a first gap and a second gap larger than the first gap. The method includes reflowing the hard mask pattern into a plurality of dome shapes; transferring the plurality of dome shapes into the micro-lens material layer to form a plurality of micro-lenses; and forming a top film conformally on the plurality of micro-lenses.

12 Claims, 10 Drawing Sheets

(56) References Cited

FOREIGN PATENT DOCUMENTS

| KR | 10-2019-0118814 | 10/2019 |
|----|-----------------|---------|
| WO | WO-2020122032 A1 | 6/2020 |
| WO | WO-2020137203 A1 | 7/2020 |
| WO | WO-2020158663 A | 8/2020 |
| WO | WO-2020175195 A1 | 9/2020 |

\* cited by examiner

IMAGE SENSOR AND METHOD FORMING THE SAME

BACKGROUND

Technical Field

The present disclosure relates to an image sensor, and it particularly relates to the arrangement of micro-lenses of the image sensor and method forming the same.

Description of the Related Art

Image sensors, such as complementary metal oxide semiconductor (CMOS) image sensors (also known as CIS), are widely used in various image-capturing apparatus such as digital still-image cameras, digital video cameras, and the like. The light sensing portion of the image sensor may detect ambient color change, and signal electric charges may be generated depending on the amount of light received in the light sensing portion. In addition, the signal electric charges generated in the light sensing portion may be transmitted and amplified, whereby an image signal is obtained.

Based on industrial demand, pixel size has continuously been reduced. In order to maintain high levels of performance, a group of Phase Difference Auto Focus (PDAF) pixels can be integrated into the conventional pixels. Light received by the group of PDAF pixels may converge through the color filter, to be collected at the corresponding sensing portions at the bottom, and the image focus for the apparatus is detected. However, an image sensor with a reduced pixel size may experience a slight offset in precision, which can significantly affect the overall performance of the device. Therefore, these and related issues need to be addressed through the design and manufacture of the image sensor.

SUMMARY

In an embodiment, a method forming an image sensor includes: providing a substrate including a plurality of sensing portions; forming a color filter layer on the substrate; forming a micro-lens material layer on the color filter layer; and forming a hard mask pattern on the micro-lens material layer. The hard mask pattern has a first gap and a second gap larger than the first gap. The method includes reflowing the hard mask pattern into a plurality of dome shapes; transferring the plurality of dome shapes into the micro-lens material layer to form a plurality of micro-lenses; and forming a top film conformally on the plurality of micro-lenses.

In another embodiment, an image sensor includes: a plurality of groups of autofocus sensor units; each of the groups of autofocus sensor units includes a plurality of sensing portions, a color filter layer disposed on the sensing portions, and a plurality of micro-lenses disposed on the color filter layer and correspondingly above the plurality of sensing portions. The image sensor includes a top film disposed conformally on the plurality of micro-lenses; a joint seam between the micro-lenses within one of the groups of autofocus sensor units has a first depth; and a gap between the micro-lenses of the plurality of groups of autofocus sensor units has a second depth, wherein the second depth is larger than the first depth.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean ±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

In response to the continually reduced pixel size, light reception of each pixel, and light reception uniformity between pixels have become a critical concern. One method of enhancing light reception of smaller pixels among the image sensor is to integrate a group of autofocus sensor units (also known as Phase Difference Auto Focus (PDAF) pixels). According to some embodiments of the present disclosure, when light is evenly received by each autofocus sensor unit (or pixel) within the group, the image sensor will be in focus. However, if light received by each autofocus sensor unit is uneven, then the image sensor would be out of focus. Therefore, the group of autofocus sensor units may detect and track image focus for the overall device. Conventionally, there is only one single micro-lens disposed above the entire group of autofocus sensor units. In other words, all autofocus sensor units within a group shares one single micro-lens, while each of the remaining sensor units has one micro-lens disposed on top. The single micro-lens above the group of autofocus sensor units may enable light to converge together for tracking and detecting. For example, when light is entered at an inclined angle, one of the autofocus sensor units within the group may receive more light than another autofocus sensor unit, and thus based on the signal reading between the autofocus sensor units, entry light direction may be accurately determined. However, conventional microlens above the group of autofocus sensor units will converge light to focus onto a center point of the group of autofocus sensor units. Each of the autofocus sensor units within the group may not receive sufficient amount of light to reflect accurate signal reading.

In the case when process overlay occurs, the micro-lens disposed above the group of autofocus sensor units may be misaligned. Since the amount of light reception on each autofocus sensor unit is already insufficient, micro-lens overlay may cause some autofocus sensor units to receive excessive amount of light, while other autofocus sensor may receive substantially nothing. When the above situation happened, the signal reading between the autofocus sensor units may be severely inaccurate, in which the determination of entry light direction may also be inaccurate. The present disclosure provides an innovative way of arranging the micro-lenses to address the above issues. The micro-lenses of the present disclosure may enable each autofocus sensor units within the group to receive sufficient amount of light, thereby increasing process window. Therefore, even in the event of process overlay, the signal reading between the autofocus sensor units may still be properly used to track and detect entry light. Furthermore, the present disclosure also includes a top film coated onto the micro-lenses to enhance the autofocus function of the image sensor.

Figure 1:
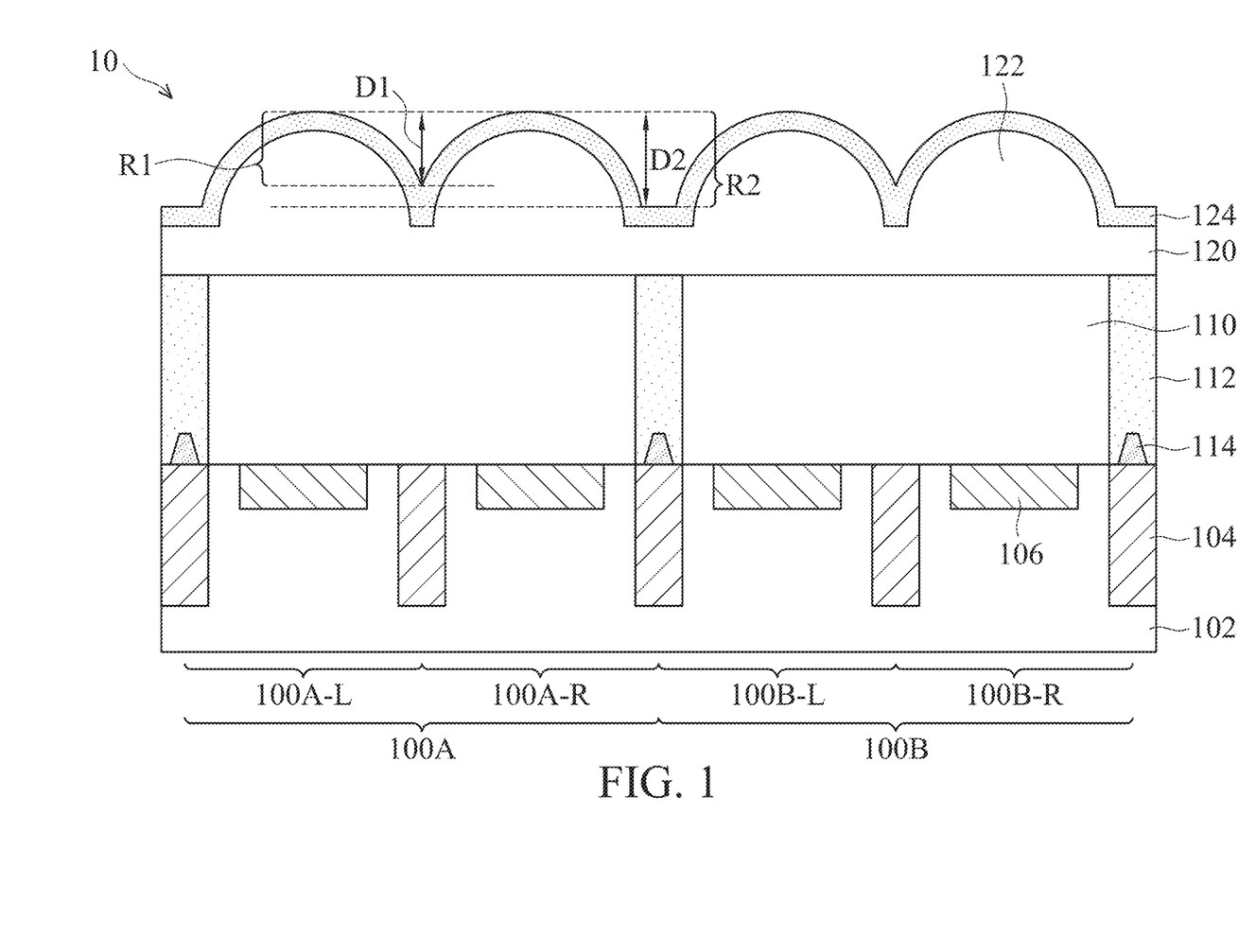
FIG. 1 is a cross-sectional view of an image sensor, according to some embodiments of the present disclosure.

FIG. 1 is a cross-sectional view of an image sensor 10, according to some embodiments of the present disclosure. In some embodiments, image sensors may contain millions of sensor units in reality. For the sake of brevity, FIG. 1 only displays a portion of an actual image sensor. The image sensor 10 shown in FIG. 1 includes two groups of autofocus sensor units 100A and 100B disposed adjacent to each other. From a top view of the image sensor 10 (not shown), each of the groups of autofocus sensor units 100A and 100B may include four sensor units arranged in 2×2, but the present disclosure is not limited thereto. For example, the group of autofocus sensor units 100A and the group of autofocus sensor units 100B may be arranged in 1×2 or 2×1 from the top view. In some embodiments, the group of autofocus sensor units 100A and the group of autofocus sensor units 100B may be arranged in 3×3, 4×4, or 5×5 from the top view. For illustration purpose, the group of autofocus sensor units 100A and the group of autofocus sensor units 100B both include one left autofocus sensor unit and one right autofocus sensor units. In particular, the group of autofocus sensor units 100A includes a left autofocus sensor unit 100A-L and a right autofocus sensor unit 100A-R, and the group of autofocus sensor units 100B includes a left autofocus sensor unit 100B-L and a right autofocus sensor unit 100B-R.

Please note that, as shown in FIG. 1, each of the group of autofocus sensor units 100A and the group of autofocus sensor units 100B has multiple micro-lenses 122, instead of the conventional single micro-lens. The left autofocus sensor unit 100A-L and the right autofocus sensor unit 100A-R, or the left autofocus sensor unit 100B-L and the right autofocus sensor unit 100B-R, each has one micro-lens 122 disposed on top, and in correspondence with each sensing portion 106 of each autofocus sensor unit. Such modification may increase process window by allowing sufficient amount of entry light to be transmitted on every sensing portion 106 of the image sensor 10. Concurrently, micro-lenses 122 may include different gaps in between, and the incorporation of a top film 124 together can enhance the autofocus function of the group of autofocus sensor units 100A and the group of autofocus sensor units 100B.

Referring to FIG. 1, each of the group of autofocus sensor units 100A and the group of autofocus sensor units 100B includes a plurality of sensing portions 106, color filter layer 110, and micro-lenses 122. The plurality of sensing portions 106 may be embedded in a substrate 102. The substrate 102 further includes a plurality of deep trench isolation structures 104 embedded within, wherein the plurality of deep trench isolation structures 104 separate each sensing portion 106, and define the size of each autofocus sensor unit. In some embodiments, the substrate 102 may be a single structure shared by all autofocus sensor units of the image sensor 10.

In some embodiments, the substrate 102 may be, for example, a wafer or a chip, but the present disclosure is not limited thereto. In some embodiments, the substrate 102 may be a semiconductor substrate, for example, silicon substrate. Furthermore, in some embodiments, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof. In some embodiments, the substrate 102 may be a photoelectric conversion substrate, such as a silicon substrate or an organic photoelectric conversion layer.

In other embodiments, the substrate 102 may also be a semiconductor on insulator (SOI) substrate. The semiconductor on insulator substrate may include a base plate, a buried oxide layer disposed on the base plate, and a semiconductor layer disposed on the buried oxide layer. Furthermore, the substrate 102 may be an N-type or a P-type conductive type.

As mentioned above, the substrate 102 may include a plurality of deep trench isolation structures 104 to define active regions, and to electrically isolate active region elements within or above the substrate 102, but the present disclosure is not limited thereto. In some embodiments, other isolation structures may be applied as an alternative. Shallow trench isolation (STI) structures and local oxidation of silicon (LOCOS) structures are examples of other isolation structures. In some embodiments, the formation of the plurality of deep trench isolation structures 104 may include, for example, forming an insulating layer on the substrate 102, selectively etching the insulating layer and the substrate 102 to form trenches that extend from a top surface of the substrate 102 to a position within the substrate, in which the trenches are located between adjacent sensing portions 106. Next, the formation of the plurality of deep trench isolation structures 104 may include growing rich nitrogen-containing (such as silicon oxynitride) liners along the trenches, followed by filling insulating materials (such as silicon dioxide, silicon nitride, or silicon oxynitride) into the trenches with deposition processes. After that, an annealing process is performed on the insulating materials in the trenches, followed by a planarization process on the substrate 102 to remove excessive insulating materials, so the insulating materials in the trenches are level with the top surface of the substrate 102.

In some embodiments, the substrate 102 may include various P-type doped regions and/or N-type doped regions (not shown) formed by, for example, an ion implantation and/or diffusion process. In some embodiments, transistors, photodiodes, or the like, may be formed at the active regions, defined by the plurality of deep trench isolation structures 104.

As mentioned above, the group of autofocus sensor units 100A and the group of autofocus sensor units 100B may each include a color filter layer 110 disposed on the substrate 102. In some embodiments, the height of the color filter layer 110 may be between approximately 0.3 µm and 2.0 µm. In some embodiments, the color filter layer 110 may include multiple units, which may be colored red, green, blue, white, or infrared. Each unit of the color filter layer 110 may corresponds to one respective sensing portion 106 of the image sensor 10, and the color of the unit depends on the requirement of each of the group of autofocus sensor units 100A and the group of autofocus sensor units 100B. The respective sensing portions 106, such as photodiodes, may convert received light signals into electric signals for each of the group of autofocus sensor units 100A and the group of autofocus sensor units 100B. In some embodiments, autofocus sensor units within the same group may have the same color units. In some embodiments, the group of autofocus sensor units 100A and the group of autofocus sensor units 100B are separated from each other by the partition grid structure 112, which will be explained in detail later. According to some embodiments of the present disclosure, the color filter layer 110 is deposited on the substrate 102 and in the space defined by the partition grid structure 112. The color filter layer 110 may be formed in sequence by a coating, exposure, and development process at different steps. Alternatively, the color filter layer 110 may be formed by ink-jet printing.

Refer to FIG. 1. A partition grid structure 112 is disposed between one or more units of the color filter layer 110. For example, the center line (not shown) of the partition grid structure 112 may define the border of the group of autofocus sensor units 100A and the group of autofocus sensor units 100B. According to some embodiments of the present disclosure, the partition grid structure 112 may have a lower refractive index than the color filter units 110. The refractive index is a characteristic of a substance that changes the speed of light, and is a value obtained by dividing the speed of light in vacuum by the speed of light in the substance. When light travels between two different materials at an angle, its refractive index determines the angle of light transmission (refraction). According to some embodiments of the present disclosure, the refractive index of the partition grid structure 112 is approximately between 1.00 and 1.99. When incident light enters the color filter layer 110, the partition grid structure 112 may isolate light rays within the specific unit to serve as the light-trapping function.

The material of the partition grid structure 112 may include a transparent dielectric material. At first, a partition material layer is coated on the substrate 102. Next, a hard mask layer (not shown) is coated on the partition material layer. In some embodiments, the material of the hard mask layer is a photoresist. A photolithography process is performed on the hard mask layer for patterning. Next, an etching process is performed on the partition material layer by using the patterned hard mask layer. The etching process may be dry etching. After the etching process, a portion of the partition material layer is removed on the substrate 102, and multiple openings are formed therein. As mentioned previously, the openings will subsequently be filled with the color filter layer 110.

Still refer to FIG. 1. A light shielding structure 114 is disposed on the substrate 102 between the group of autofocus sensor units 100A and the group of autofocus sensor units 100B. In some embodiments, the light shielding structure 114 is embedded within the partition grid structure 112. In some embodiments, the partition grid structure 112 may be higher than or equal to the height of the light shielding structure 114, depending on the design requirement of the image sensors 10. In some embodiments, the light shielding structure 114 spans across the border of the group of autofocus sensor units 100A and the group of autofocus sensor units 100B. In other word, the light shielding structure 114 is disposed in a way shared by any two adjacent autofocus sensor units. The arrangement of the light shielding structure 114 may prevent one of the sensing portions 106 under the corresponding unit of the color filter layer 110 to receive additional light from an adjacent unit of different color, which may affect the accuracy of signals received. In some embodiments of the present disclosure, the height of the light shielding structure 114 may be approximately between 0.005 µm and 2.000 µm. In some embodiments, the material of the light shielding structure 114 may include opaque metals (such as tungsten (W), aluminum (Al)), opaque metal nitride (such as titanium nitride (TiN)), opaque metal oxide (such as titanium oxide (TiO)), other suitable materials, or a combination thereof, but the present disclosure is not limited thereto. The light shielding structure 114 may be formed by depositing a metal layer on the substrate 102 and then patterning the metal layer using photolithography and etching processes to form the light shielding structure 114, but the present disclosure is not limited thereto.

Still Refer to FIG. 1. A micro-lens material layer 120 is disposed on the color filter layer 110 and the partition grid structure 112. According to some embodiments of the present disclosure, a plurality of micro-lenses 122 are disposed on the micro-lens material layer 120, in which the plurality of micro-lenses 122 correspond to the plurality of sensing portions 106. As stated previously, the conventional single micro-lens disposed above the group of autofocus sensor units 100A or 100B will lead to a light convergence focusing mostly on the center point of the group of autofocus sensor units 100A or 100B. Unfortunately, when using the conventional single micro-lens, the center point of the group of autofocus sensor units 100A or 100B is the location of the deep trench isolation structures, instead of the location of any of the sensing portions 106. Therefore, the image sensor 10 of the disclosure is designed to have the plurality of micro-lenses 122 correspondingly above the plurality of sensing portions 106. The resulting structure shown in FIG. 1 may enable entry light to converge mostly on every sensing portion 106, therefore solving the light convergence issue.

Furthermore, the micro-lenses 122 of the disclosure are designed to have two or more different gaps to improve the autofocus function. Note that, forming multiple micro-lenses 122 (instead of one micro-lens) may inadvertently disable the autofocus function. Since every autofocus sensor unit include its own micro-lens 122, and the plurality of micro-lenses 122 are identical, light reception on each sensing portion 106 will be substantially the same. The signal reading between the autofocus sensor units within the group may be impossible for users to track and detect the entry light, and thus impossible to determine the entry light direction. To overcome this issue, two adjacent micro-lenses 122 within the same group of autofocus sensor units 100A or 100B are designed to have a gap that is different from two adjacent micro-lenses 122 between the group of autofocus sensor units 100A and the group of autofocus sensor units 100B. For example, the gap between the micro-lens 122 on the left autofocus sensor unit 100A-L and the micro-lens 122 on the right autofocus sensor unit 100A-R of the group of autofocus sensor units 100A is smaller than the gap between the micro-lens 122 on the right autofocus sensor unit 100A-R of the group of autofocus sensor units 100A and the micro-lens 122 on the left autofocus sensor unit 100B-L of the group of autofocus sensor units 100B. It has been found that a difference in gap between micro-lenses 122 may allow the image sensor 10 to regain the original autofocus function.

Furthermore, a top film 124 is introduced in the present disclosure to further strengthen the autofocus function of the image sensor 10. As shown in FIG. 1, after the top film 124 is conformally deposited onto the surface of the plurality of micro-lenses 122 (and the exposed surface of micro-lens material layer 120), the gap between the micro-lens 122 on the left autofocus sensor unit 100A-L and the micro-lens 122 on the right autofocus sensor unit 100A-R of the group of autofocus sensor units 100A becomes a joint seam that has a first depth D1, and the gap between the micro-lens 122 on the right autofocus sensor unit 100A-R of the group of autofocus sensor units 100A and the micro-lens 122 on the left autofocus sensor unit 100B-L of the group of autofocus sensor units 100B has a second depth D2, wherein the first depth D1 is smaller than the second depth D2. Furthermore, the first depth D1 defines the joint seam between micro-lenses 122 within the group of autofocus sensor units 100A or 100B, and the portion of the micro-lenses 122 within the joint seam has a first radius of curvature R1. The second depth D2 defines the gap of the micro-lenses 122 between the group of autofocus sensor units 100A and the group of autofocus sensor units 100B, and the portion of the micro-lenses 122 within the gap has a second radius of curvature R2. According to some embodiments of the present disclosure, the first radius of curvature R1 is larger than the second radius of curvature R2. The combination of the gap size difference, the gap depth difference, and the radius of curvature difference between the micro-lenses 122 may enable the image sensor 10 to regain autofocus function, while every sensing portion 106 can receive sufficient amount of the entry light.

As shown in FIG. 1, according to some embodiments, an image sensor of the present disclosure includes: a plurality of groups of autofocus sensor units 100A/100B; each of the groups of autofocus sensor units 100A/100B includes a plurality of sensing portions 106, a color filter layer 110 disposed on the sensing portions 106, and a plurality of micro-lenses 122 disposed on the color filter layer 110 and correspondingly above the plurality of sensing portions 106. The image sensor includes a top film 124 that is conformally disposed on the plurality of micro-lenses 122; a joint seam between the micro-lenses 122 within one of the groups of autofocus sensor units 100A/100B has a first depth D1; and a gap between the micro-lenses 122 of the plurality of groups of autofocus sensor units 100A/100B has a second depth D2, wherein the second depth D2 is larger than the first depth D1.

FIGS. 2A-2E are cross-sectional views of the image sensor 10 at various intermediate fabrication stages, according to some embodiments of the present disclosure. Since the present disclosure mainly focuses on the micro-lenses 122 and the top film 124, the process features of the substrate 102, the plurality of deep trench isolation structures 104, the plurality of sensing portions 106, the color filter layer 110, the partition grid structure 112, and the light shielding structure 114 will not be described in detail herein. According to some embodiments of the present disclosure, a micro-lens material layer 120 is disposed on the top surfaces of the color filter layer 110 and the partition grid structure 112. In some embodiments, the material of the micro-lens material layer 120 may be a transparent material. For example, the material may include glass, epoxy resin, silicone resin, polyurethane, any other applicable material, or a combination thereof, but the present disclosure is not limited thereto. Next, a hard mask layer 130 is formed above the micro-lens material layer 120. In some embodiments, the hard mask layer 130 includes any resin-containing materials, or a combination thereof. In some embodiments, the hard mask layer 130 may have a thickness smaller than that of the micro-lens material layer 120. In the present embodiment, a photomask 140 is introduced into the fabrication of the image sensor 10, and particularly for the patterning of the hard mask layer 130. According to some embodiments of the present disclosure, the photomask 140 may include various transparent portions 140a and non-transparent portions 140b, which are used during the photolithography process to pattern the hard mask layer 130.

Figure 2A:
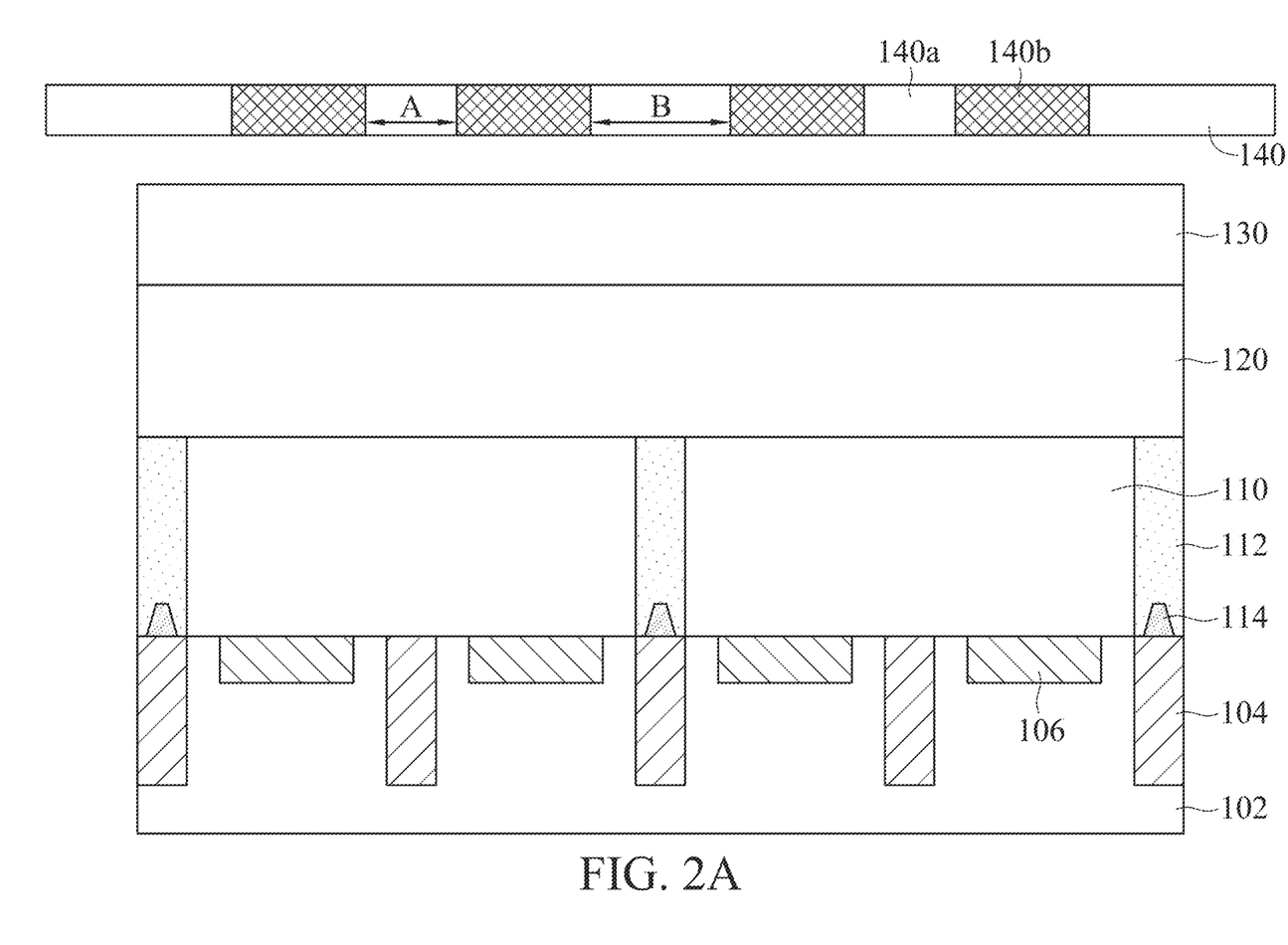
FIGS. 2A-2E are cross-sectional views of the image sensor in FIG. 1 at various intermediate fabrication stages, according to some embodiments of the present disclosure.

In some embodiments, the photolithography process may include forming a photoresist (not shown) by spin-on coating onto the hard mask layer 130, followed by performing an exposure process on the photoresist using the photomask 140. In the present embodiment, the non-transparent portions 140b of the photomask 140 may define portions of the hard mask layer 130 to be remained, while the transparent portions 140a of the photomask 140 may define other portions of the hard mask layer 130 to be removed. The photomask 140 is designed to have transparent portions 140a with specific widths, which may correspond to gap sizes within the subsequently formed hard mask pattern 132. After exposure, a development process is performed on the photoresist. Then, the hard mask layer 130 is etched through the patterned photoresist, thus completing the patterning of the hard mask layer 130.

Figure 2B:
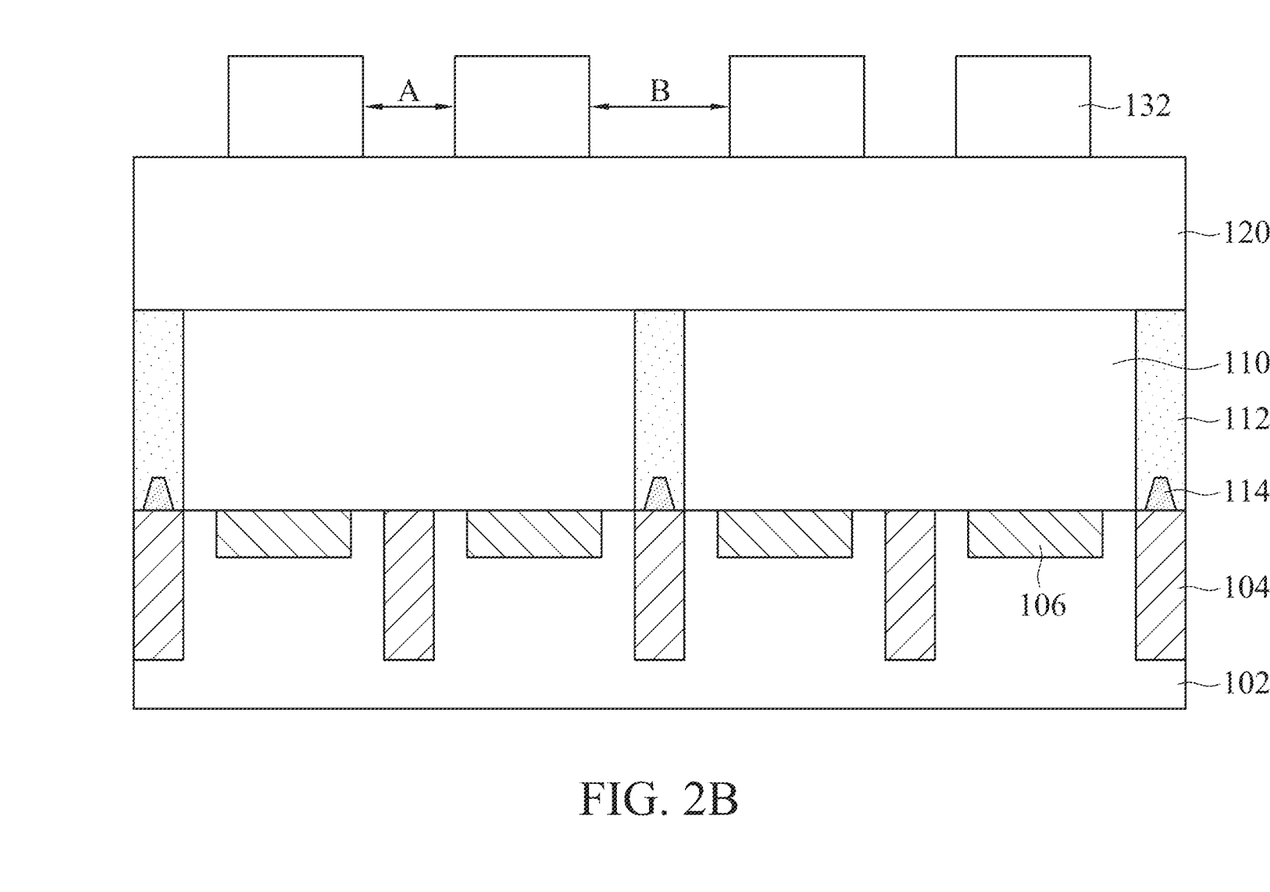

Refer to FIG. 2B. As a result of the photolithography patterning and etching, the hard mask layer 130 may form into a hard mask pattern 132. From the predetermined design of the photomask 140, the hard mask pattern 132 may include a first gap A and a second gap B between the remaining portions of the hard mask layer 130. According to some embodiments of the present embodiments, the size of the first gap A is in a range between about 10% and about 20% of the size of the autofocus sensor unit, which is defined by the plurality of deep trench isolation structures 104, while the size of the second gap B is in a range between about 30% and about 40% of the size of the autofocus sensor unit, which is also defined by the plurality of deep trench isolation structures 104.

Figure 2C:
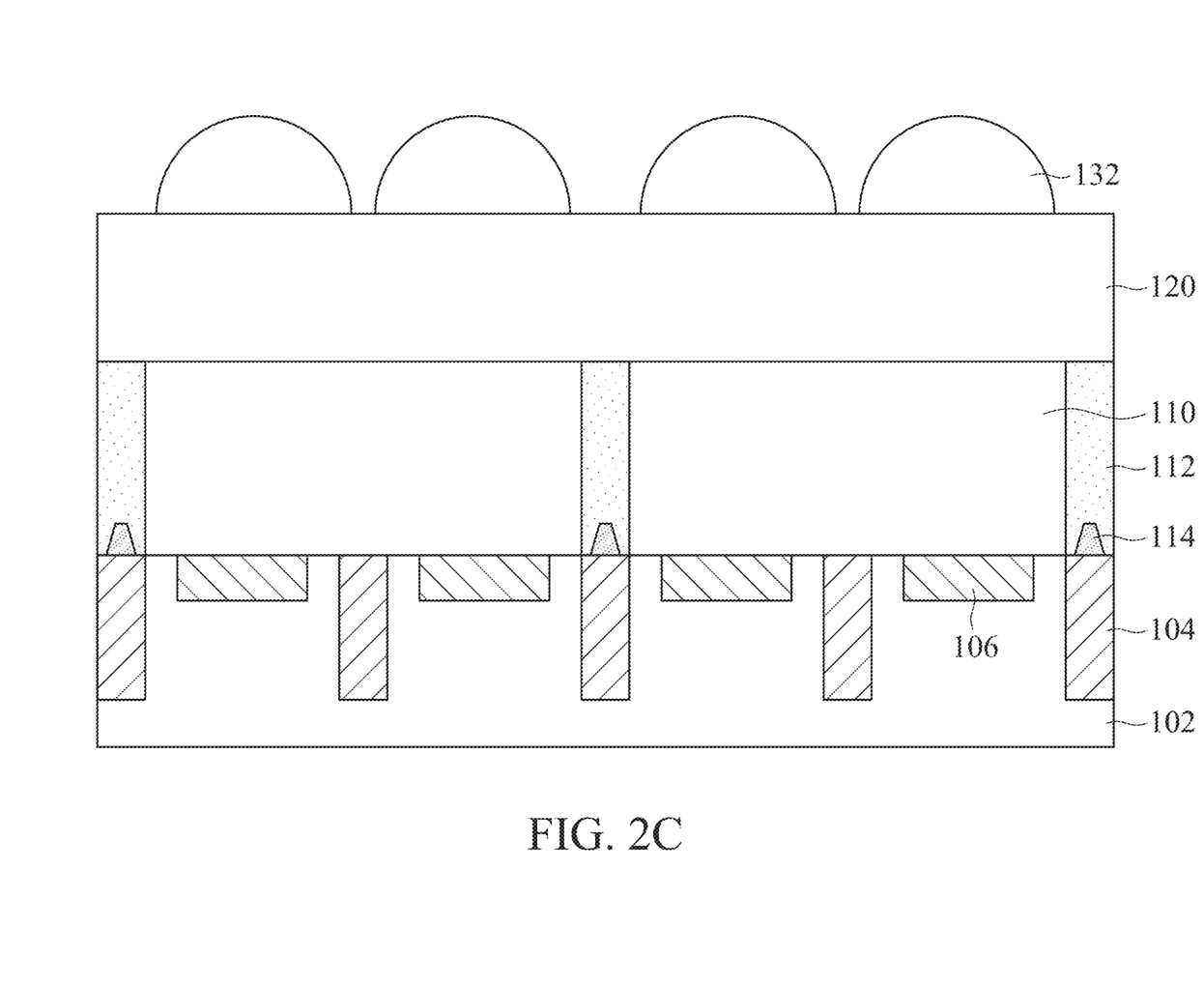

Refer to FIG. 2C. A reflow process is performed on the hard mask pattern 132. The reflow process is performed by heating the hard mask pattern 132 at a temperature higher than the glass transition temperature of the hard mask layer 130. For example, the reflow process may be performed at a temperature between about 130° C. and 160° C., for an appropriate amount of duration, depending on the material of the hard mask layer 130. Please note that, the hard mask pattern 132 is substantially rectangular before the reflow process, and may become dome shaped after the reflow process. Furthermore, the reflow process will change the sizes of the first gap A and the second gap B, measured at the bottom of the hard mask pattern 132. In particular, the reflow process will shrink the sizes of the first gap A and the second gap B by approximately 10% to 30%.

Figure 2D:
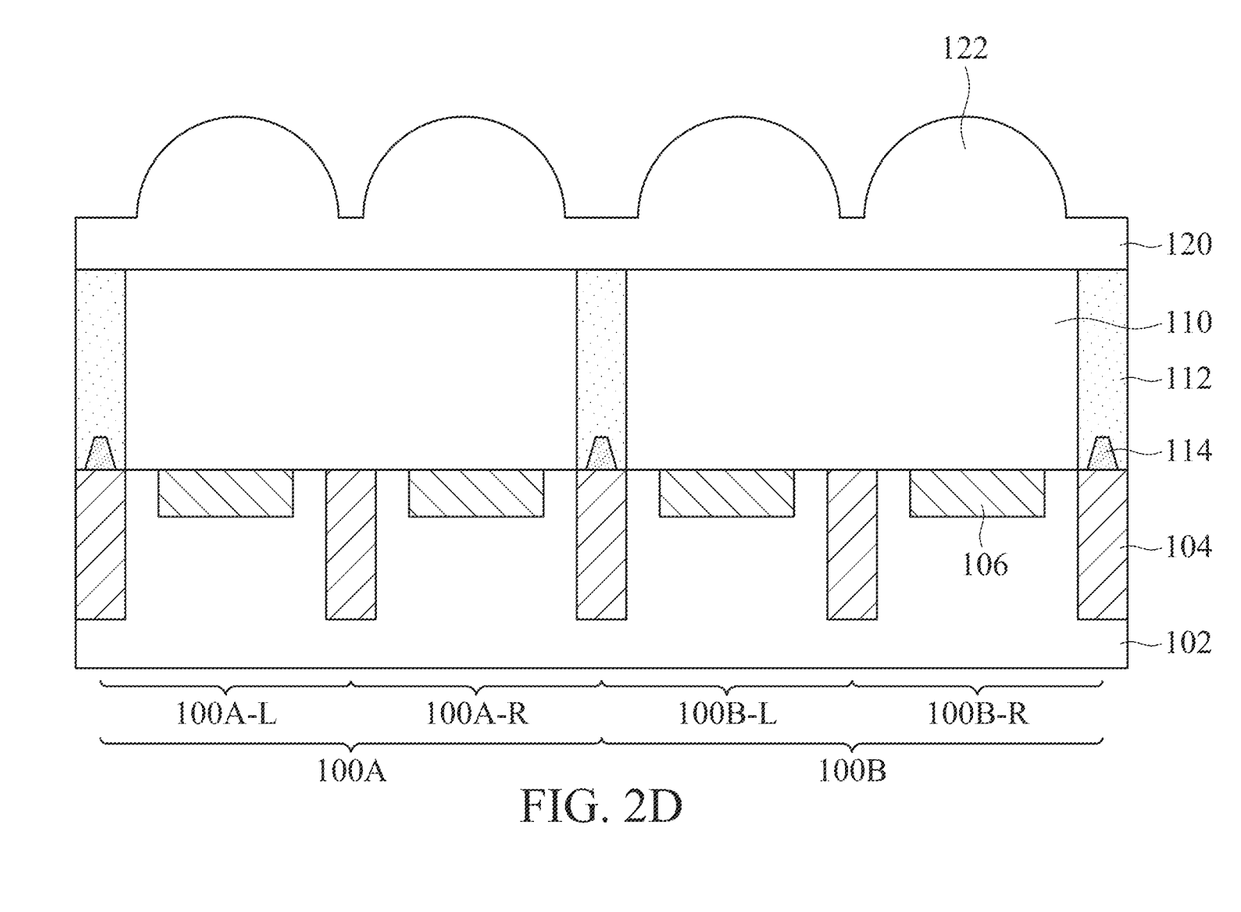

Refer to FIG. 2D. According to some embodiments of the present disclosure, both the reflowed hard mask pattern 132 and the micro-lens material layer 120 are etched simultaneously by a dry etching process. In some embodiments, one or more cycles of dry etching processes may be performed, until the shape of the hard mask pattern 132 is completely transferred to the micro-lens material layer 120. Please note that during the dry etching processes, only the top portion of the micro-lens material layer 120 will be etched, while the remaining bottom portion of the micro-lens material layer 120 is un-etched. In some embodiments, the dry etching processes may use etching gas that includes $CF_4$, $CHF_3$, $C_4F_8$, $NF_3$, $O_2$, $CO_2$, $N_2$, or a combination thereof, and may be diluted in $Ar_2$. In the present embodiment, etching selectivity of the hard mask pattern 132 to the micro-lens material layer 120 may be controlled between about 1:1 and 1:3. After the dry etching processes, the top portion of the micro-lens material layer 120 may result in a plurality of micro-lenses 122, while the bottom portion of the micro-lens material layer 120 may serve as a base for the micro-lenses 122.

Figure 2E:
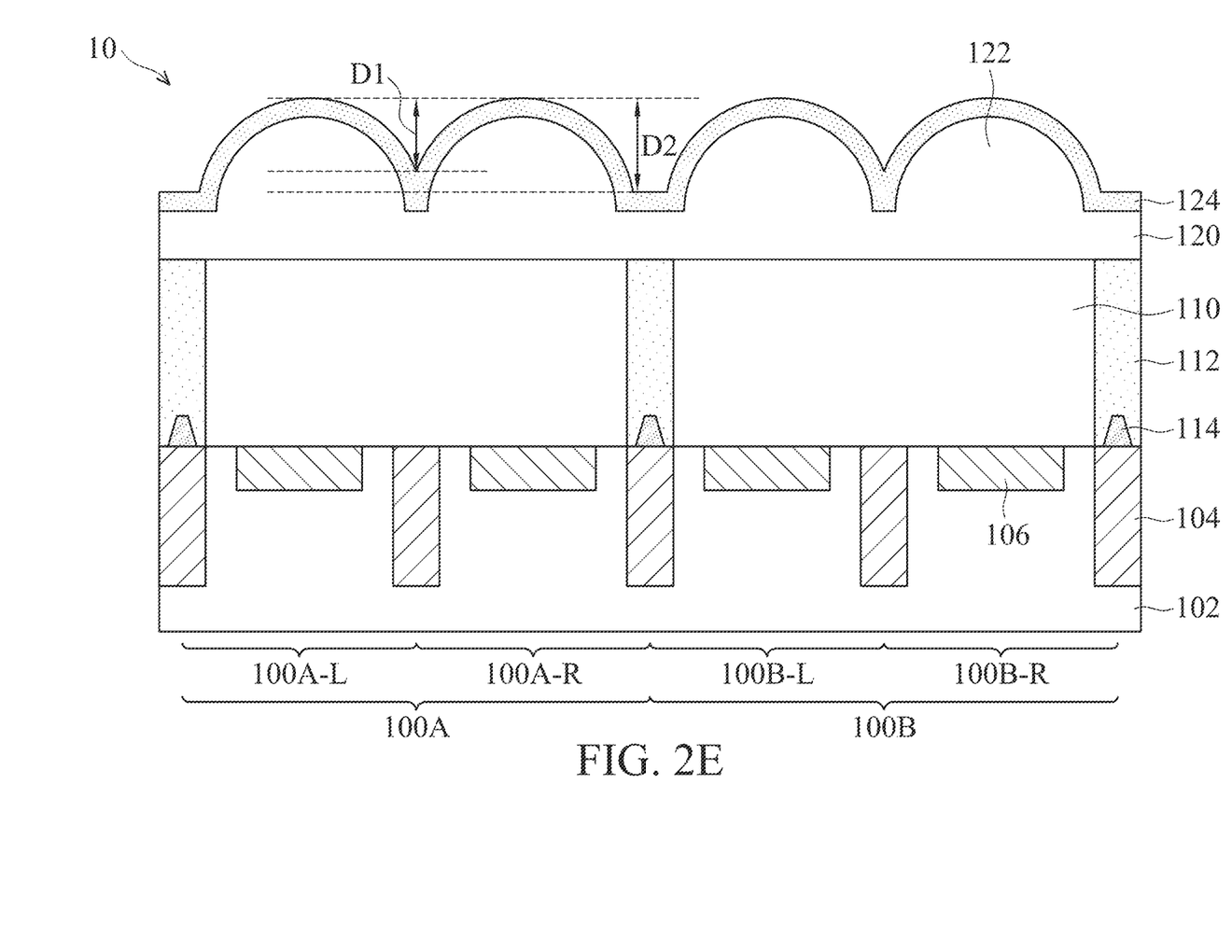

Refer to FIG. 2E. A top film 124 is conformally deposited onto the top surface of the plurality of micro-lenses 122 and the exposed surface of the bottom portion of the micro-lens material layer 120. In some embodiments, the top film 124 is a continuous structure that covers the entire surface of the image sensor 10. According to some embodiments of the present disclosure, the material of the top film 124 has a lower refractive index than that of the micro-lenses 122 (or the micro-lens material layer 120). In some embodiments, the top film 124 may be a transparent material including, for example, a glass, epoxy resin, silicone resin, polyurethane, other suitable materials, or a combination thereof, but the present disclosure is not limited thereto. The formation of the top film 124 may include deposition processes, which may include, for example, spin-on coating process, chemical vapor deposition (CVD), physical vapor deposition (PVD), atomic layer deposition (ALD), other suitable methods, or a combination thereof.

According to some embodiments of the present disclosure, FIGS. 2A-2E illustrate a process flow of fabricating the image sensor 10. By utilizing the hard mask pattern 132 with two different predetermined spacing (the first gap A and the second gap B), the resulting micro-lenses 122 may have two gaps: one relatively smaller gap within the group of autofocus sensor units 100A or 100B, and another relatively larger gap between the group of autofocus sensor units 100A and the group of autofocus sensor units 100B. According to some embodiments of the present disclosure, incorporating the top film 124 may increase the difference in sizes between the two gaps. Furthermore, after depositing the top film 124, the relatively smaller gap may become a joint seam, which has a first depth D1 that is smaller than the second depth D2 of the relatively larger gap. The above features of the micro-lenses 122, not only may solve the issue where each sensing portion 106 receives insufficient amount of entry light, but also achieve autofocus function that a conventional Phase Difference Auto Focus pixel possesses.

Figure 3A:
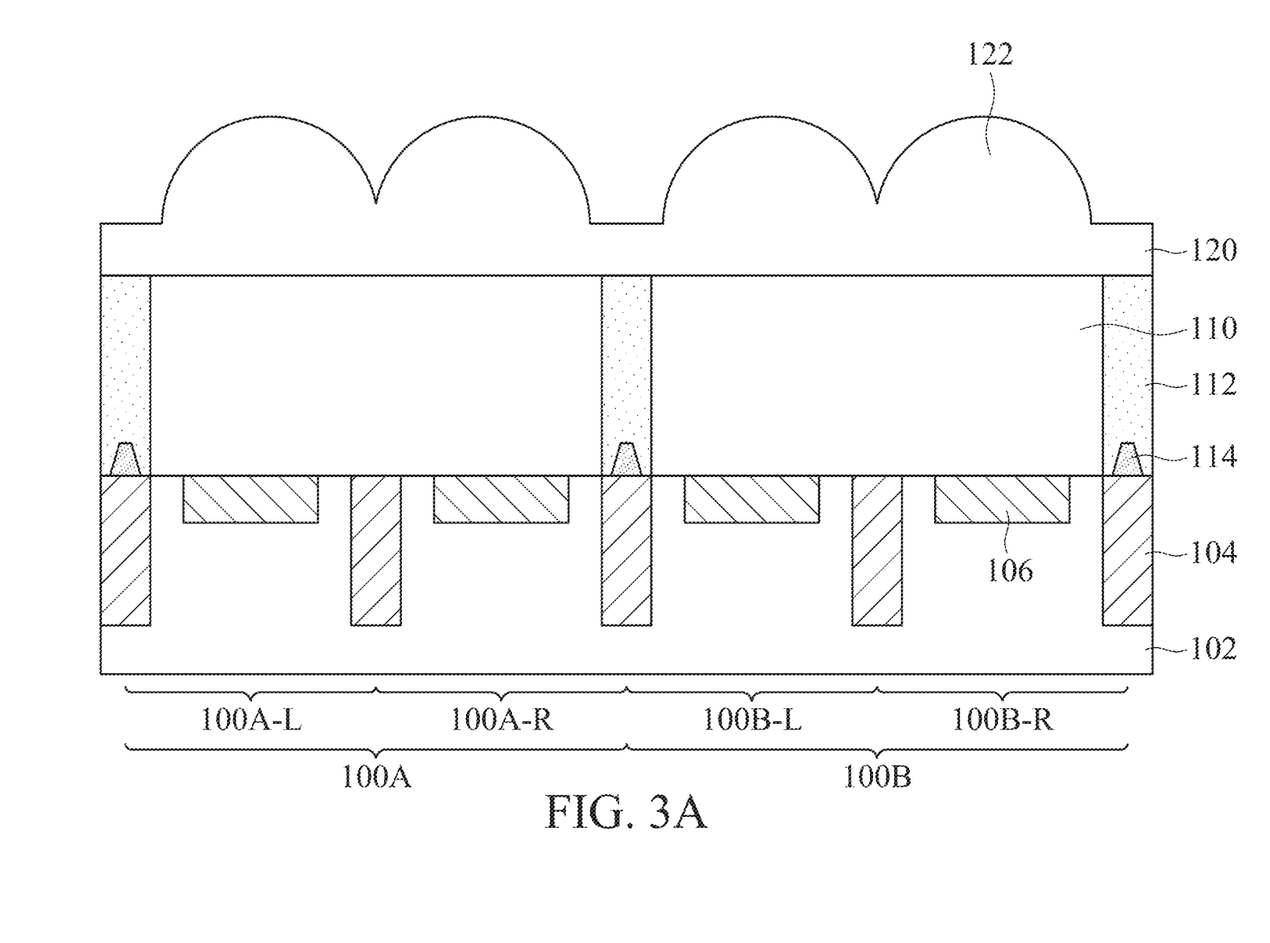
FIGS. 3A-3B are cross-sectional views of another image sensor at various intermediate fabrication stages, according to other embodiments of the present disclosure.
Figure 3B:
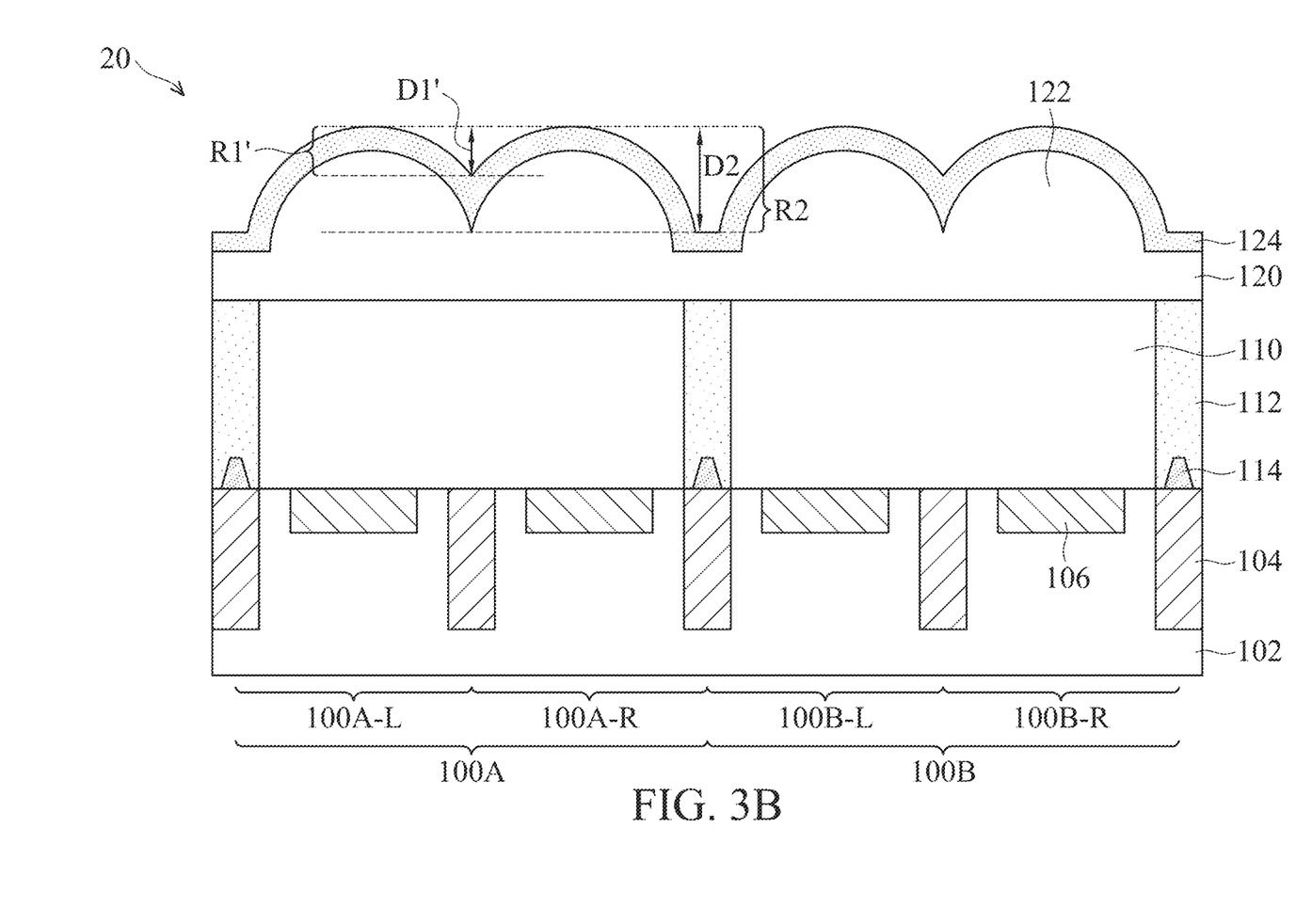

FIGS. 3A and 3B are cross-sectional views of another image sensor at various intermediate fabrication stages, according to other embodiments of the present disclosure. FIGS. 3A and 3B illustrate the process flow of an image sensor 20. In comparison with the image sensor 10 shown in FIG. 2E, micro-lenses 122 within the group of autofocus sensor units 100A or 100B of the image sensor 20 are adjoining each other. The features of the substrate 102, the plurality of deep trench isolation structures 104, the plurality of sensing portions 106, the color filter layer 110, the partition grid structure 112, and the light shielding structure 114 of the image sensor 20 are similar to those of the image sensor 10, and the details are not described again herein to avoid repetition.

Refer to FIG. 3A. The photomask 140 in this embodiment (not shown for simplicity) is designed such that the resulting micro-lenses 122 within the group of autofocus sensor units 100A or 100B are substantially adjoining each other. The gap of the image sensor 20, between the micro-lens 122 on the right autofocus sensor unit 100A-R of the group of autofocus sensor units 100A and the micro-lens 122 on the left autofocus sensor unit 100B-L of the group of autofocus sensor units 100B, is substantially equal to that of the image sensor 10.

Refer to FIG. 3B. A top film 124 is conformally deposited onto the top surface of the plurality of micro-lenses 122 and the exposed surface of the bottom portion of the micro-lens material layer 120. In some embodiments, the top film 124 is a continuous structure that covers the entire surface of the image sensor 20. According to some embodiments of the present disclosure, the material of the top film 124 has a lower refractive index than that of the micro-lenses 122 (or the micro-lens material layer 120). After the deposition of the top film 124, the joint seam between the micro-lens 122 on the left autofocus sensor unit 100A-L and the micro-lens 122 on the right autofocus sensor unit 100A-R of the group of autofocus sensor units 100A has a first depth D1', and the gap between the micro-lens 122 on the right autofocus sensor unit 100A-R of the group of autofocus sensor units 100A and the micro-lens 122 on the left autofocus sensor unit 100B-L of the group of autofocus sensor units 100B has a second depth D2, wherein the first depth D1' is smaller than the second depth D2. Please note that the first depth D1' of the image sensor 20 is smaller than the first depth D1 of the image sensor 10, while the second depth D2 of the image sensor 20 is substantially equal to the second depth D2 of the image sensor 10.

Still refer to FIG. 3B. The first depth D1' defines the joint seam between micro-lenses 122 within the group of autofocus sensor units 100A or 100B, and the portion of the micro-lenses 122 within the joint seam has a first radius of curvature R1'. The second depth D2 defines the gap of the micro-lenses 122 between the group of autofocus sensor units 100A and the group of autofocus sensor units 100B, and the portion of the micro-lenses 122 within the gap has a second radius of curvature R2. According to some embodiments of the present disclosure, the first radius of curvature R1' is larger than the second radius of curvature R2. Please note that the first radius of curvature R1' of the image sensor 20 is larger than the first radius of curvature R1 of the image sensor 10, while the second radius of curvature R2 of the image sensor 20 is substantially equal to the second radius of curvature R2 of the image sensor 10. Compared to the image sensor 10, the resulting structure of the image sensor 20 illustrates that the difference between the first depth D1' and the second depth D2, and the difference between the first radius of curvature R1' and the second radius of curvature R2 are both larger than those from the image sensor 10. In some embodiments, the image sensor 20 may have a more effective autofocus function than the image sensor 10 for tracking and detecting entry light.

Figure 4A:
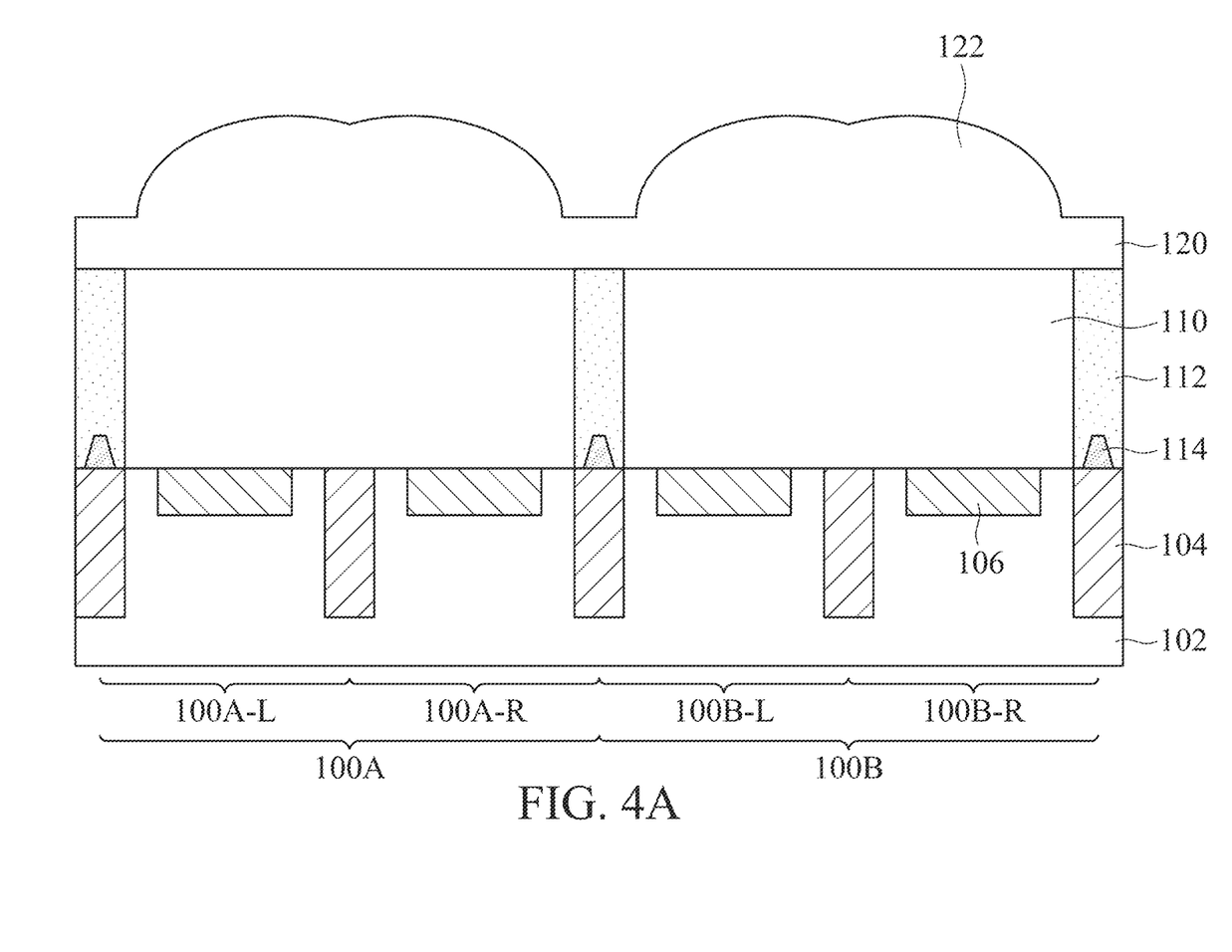
FIGS. 4A-4B are cross-sectional views of yet another image sensor at various intermediate fabrication stages, according to other embodiments of the present disclosure.
Figure 4B:
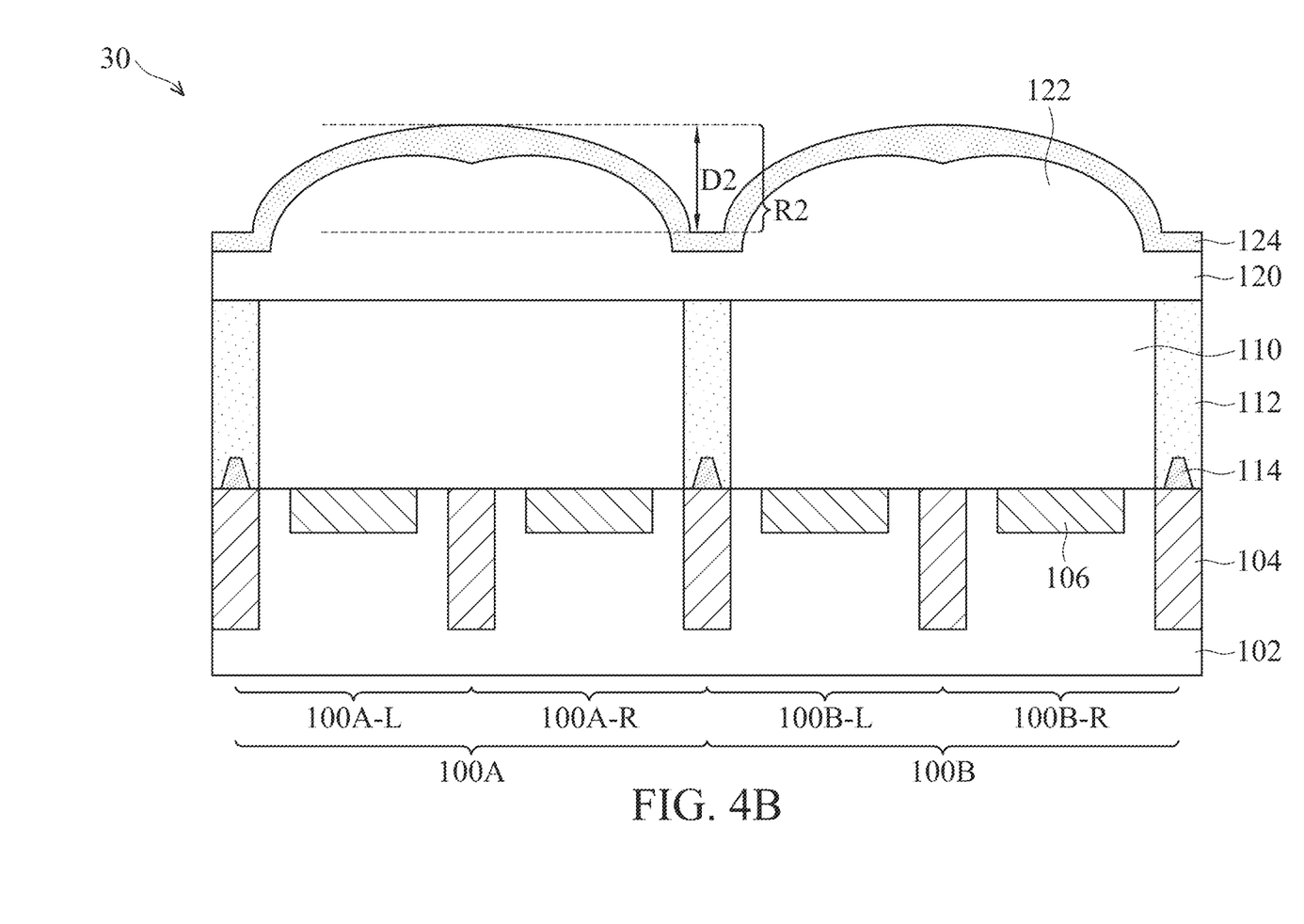

FIGS. 4A and 4B are cross-sectional views of yet another image sensor at various intermediate fabrication stages, according to other embodiments of the present disclosure. FIGS. 4A and 4B illustrate the process flow of an image sensor 30. In comparison with the image sensor 10 shown in FIG. 2E and the image sensor 20 shown in FIG. 3B, micro-lenses 122 within the group of autofocus sensor units 100A or 100B of the image sensor 30 are overlapping each other. The features of the substrate 102, the plurality of deep trench isolation structures 104, the plurality of sensing portions 106, the color filter layer 110, the partition grid structure 112, and the light shielding structure 114 of the image sensor 30 are similar to those of the image sensor 10 or the image sensor 20, and the details are not described again herein to avoid repetition.

Refer to FIG. 4A. The photomask 140 in this embodiment (not shown for simplicity) is designed such that the resulting micro-lenses 122 within the group of autofocus sensor units 100A or 100B are overlapping each other. The gap of the image sensor 30, between the micro-lens 122 on the right autofocus sensor unit 100A-R of the group of autofocus sensor units 100A and the micro-lens 122 on the left autofocus sensor unit 100B-L of the group of autofocus sensor units 100B, is substantially equal to that of the image sensor 10 or the image sensor 20.

Refer to FIG. 4B. A top film 124 is conformally deposited onto the top surface of the plurality of micro-lenses 122 and the exposed surface of the bottom portion of the micro-lens material layer 120. In some embodiments, the top film 124 is a continuous structure that covers the entire surface of the image sensor 30. According to some embodiments of the present disclosure, the material of the top film 124 has a lower refractive index than that of the micro-lenses 122 (or the micro-lens material layer 120). After the deposition of the top film 124, a substantial rounded top surface is formed between the micro-lenses 122 within the group of autofocus sensor units 100A or 100B, where a first depth does not exist, and the gap between the micro-lens 122 on the right autofocus sensor unit 100A-R of the group of autofocus sensor units 100A and the micro-lens 122 on the left autofocus sensor unit 100B-L of the group of autofocus sensor units 100B still has a second depth D2. Please note that the second depth D2 of the image sensor 30 is substantially equal to the second depth D2 of the image sensor 10 or the image sensor 20.

Still refer to FIG. 4B. Please note that, specifically in this embodiment, the portion of the top film 124 covering the group of autofocus sensor units 100A or 100B appears to be a single micro-lens structure from an external appearance, which is extremely similar to a conventional Phase Difference Auto Focus pixel structure. The second depth D2 defines the gap of the micro-lenses 122 between the group of autofocus sensor units 100A and the group of autofocus sensor units 100B, and a portion of the micro-lenses 122 within the gap has a second radius of curvature R2. Compared to the image sensor 10 and the image sensor 20, the resulting structure of the image sensor 30 illustrates that from an external appearance, there exist only one specific depth (for example, the second depth D2) and one specific radius of curvature (for example, the second radius of curvature R2). In this way, the image sensor 30 may function as a conventional Phase Difference Auto Focus pixel for tracking and detecting the entry light, but without the issue where the sensing portions 106 receive insufficient amount of the entry light.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A method forming an image sensor, comprising:
   providing a substrate comprising a plurality of sensing portions;

forming a color filter layer on the substrate;

forming a micro-lens material layer on the color filter layer;

forming a hard mask pattern on the micro-lens material layer, wherein the hard mask pattern has a first gap and a second gap larger than the first gap;

reflowing the hard mask pattern into a plurality of dome shapes;

transferring the plurality of dome shapes into the micro-lens material layer to form a plurality of micro-lenses; and forming a top film conformally on the plurality of micro-lenses.

2. The method of claim 1, wherein the substrate further comprises a plurality of deep trench isolation (DTI) structures separating the plurality of sensing portions.

3. The method of claim 2, wherein forming the plurality of deep trench isolation structures defines a size of an autofocus sensor unit.

4. The method of claim 3, wherein two or more of the autofocus sensor unit constitute a group of autofocus sensor units.

5. The method of claim 4, before the forming of the color filter layer on the substrate, further comprises forming a partition grid structure within the color filter layer, wherein the partition grid structure surrounds the group of autofocus sensor units.

6. The method of claim 5, before the forming of the partition grid structure, further comprises forming a light shielding structure embedded within the partition grid structure.

7. The method of claim 5, wherein forming the hard mask pattern comprises forming the first gap within the partition grid structure.

8. The method of claim 5, wherein forming the hard mask pattern comprises forming the second gap directly above the partition grid structure.

9. The method of claim 3, wherein the first gap is in a range between about 10% and about 20% of the size of the autofocus sensor unit.

10. The method of claim 3, wherein the second gap is in a range between about 30% and about 40% of the size of the autofocus sensor unit.

11. The method of claim 1, wherein the forming of the plurality of micro-lenses are only through a top portion of the micro-lens material layer.

12. The method of claim 1, wherein a refractive index of the top film is lower than a refractive index of the micro-lenses.

* * * * *